USOO6762648B1

(12) United States Patent
Kurzbauer

(10) Patent No.: US 6,762,648 B1
(45) Date of Patent: Jul. 13, 2004

(54) DEVICE AND METHOD FOR PRODUCTION OF A CLOCK SIGNAL

(75) Inventor: Werner Kurzbauer, Munich (DE)

(73) Assignee: Mikron Aktiengesellschaft fur integrierte Mikroelektronik, Hallbergmoos (DE)

( * ) Notice: Subject to any disclaimer, the term of this patent is extended or adjusted under 35 U.S.C. 154(b) by 17 days.

(21) Appl. No.: 10/129,554

(22) PCT Filed: Nov. 8, 2000

(86) PCT No.: PCT/DE00/03926

§ 371 (c)(1),
(2), (4) Date: Oct. 22, 2002

(87) PCT Pub. No.: WO01/35533

PCT Pub. Date: May 17, 2001

(30) Foreign Application Priority Data

Nov. 8, 1999 (DE) .......................................... 199 53 578

(51) Int. Cl.[7] ................................................. H03L 7/00
(52) U.S. Cl. ..................................... 331/17; 331/177 R
(58) Field of Search ........................ 331/17, 111, 177 R

(56) References Cited

U.S. PATENT DOCUMENTS

| 4,520,327 | A | | 5/1985 | Myers ..................... 331/177 R |
| 5,617,062 | A | | 4/1997 | O'Shaughnessy et al. .. 331/111 |
| 6,060,955 | A | * | 5/2000 | Thomsen .................... 331/111 |
| 6,163,225 | A | * | 12/2000 | Sundaram et al. ............ 331/57 |

FOREIGN PATENT DOCUMENTS

| DE | 3629476 A1 | 3/1988 |
| DE | 37 26 224 C2 | 2/1989 |
| DE | 39 09 200 C2 | 9/1990 |
| DE | 42 00 234 A1 | 7/1993 |
| DE | 692 09 605 T2 | 9/1996 |
| DE | 197 15 274 A1 | 10/1998 |
| GB | 1 412 718 | 11/1975 |

* cited by examiner

*Primary Examiner*—Robert Pascal
*Assistant Examiner*—Joseph Chang
(74) *Attorney, Agent, or Firm*—Edell, Shapiro & Finnan, LLC

(57) ABSTRACT

A device and method for production of a signal of constant frequency are disclosed. Said device comprises an integrator and an adjustable oscillator. Said integrator is for integration of an input current, whereby the integrator serves as a charge store. The output parameter of the integrator are used as input parameters for the adjustable oscillator. Whereby charge packets defined with the output frequency of the adjustable oscillator are drawn off. Further more a VCO (1) is preferably used as adjustable oscillator, with a signal of constant frequency ($f_{VCO}$) available at the output thereof. The VCO (1) is integrated into a control circuit in such a way that the frequency ($f_{VCO}$) is only determined by circuit components, contained in the control circuit, with low temperature coefficients, whereby a low temperature coefficient, relatively low space requirement and a relatively low current requirement are guaranteed.

18 Claims, 3 Drawing Sheets

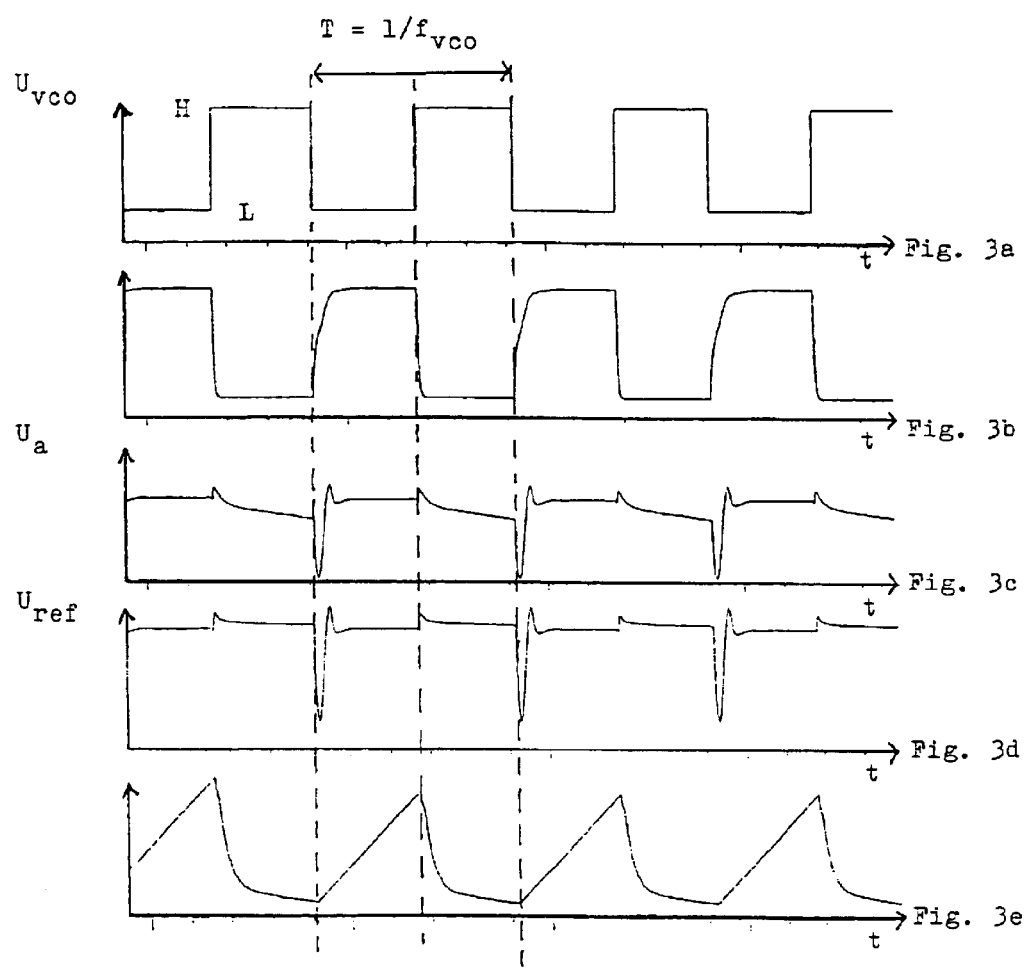

DEVICE AND METHOD FOR PRODUCTION OF A CLOCK SIGNAL

BACKGROUND OF THE INVENTION

The present invention relates to an apparatus and a method for generation of a clock signal, i.e. an alternating signal having a constant frequency, in accordance with claim 1 and claim 9, respectively.

A signal generated in this manner offers, for instance, various applications in apparatuses and circuits, respectively, in which a time basis is required for certain time controls, (closed-loop) controls and/or measurements. A special application of such a time basis is the use in a so-called intelligent rechargeable battery. In these rechargeable batteries an intelligent component is integrated in form of a chip in which the previous history of the rechargeable battery, i.e., in particular, its current charging state, its maximum charging capacity and so on are stored. When during the process of the charging of the rechargeable battery its previous history and charging parameters are known then a, substantially more effective, i.e., in particular, faster and more complete, recharging of the rechargeable battery is possible.

For obtaining the previous history of the rechargeable battery such a chip requires a time basis in order to accurately sample the time behavior of the charging and discharging processes. As classic circuits for generation of a signal useable as a time basis and a clock signal, respectively, for instance conventional RC oscillators are known which generate an unattenuated electric oscillation having a certain curve shape and frequency having a constant amplitude. However, such RC oscillators comprise a relatively high temperature coefficient so that a high constancy of the frequency of the output signal and thereby a high accuracy of the corresponding time basis cannot be achieved in the case of variations of temperature and have a relatively high consumption of current which is disadvantageous, in particular, in the application in intelligent rechargeable batteries. In order to increase the constancy and accuracy, respectively, of RC oscillators these are often trimmed using additional oscillation circuits.

A further known possibility for generation of a time basis is the use of quartz oscillator. A quartz oscillator distinguishes itself particularly by its high constancy in frequency and its low temperature coefficient. However, such quartz oscillators are, in general, relatively expensive and relatively big. Moreover, the high accuracy of a time basis generated by a quartz oscillator is not necessarily required with some applications such as also with intelligent rechargeable batteries.

Further, in the prior art so called VCO's (voltage controlled oscillator) are known. The VCO is a voltage-frequency converter and substantially consists of an integrator and a trigger. The frequency of the output signal of the VCO is proportional to the control voltage of the VCO. However, the VCO also comprises a high temperature coefficient for the output frequency so that with variations of temperature no time basis can be ensured having a sufficiently high accuracy.

SUMMARY OF THE INVENTION

Starting from the afore-mentioned prior art it is an object of the present invention to provide an apparatus and method for generation of a signal having a constant frequency with which the above-mentioned disadvantages of the prior art are avoided. In particular, an apparatus and a method for generation of a signal having a constant frequency shall be provided which comprise a sufficiently high constancy of frequency and a low temperature coefficient with relatively little space requirements and relatively little power consumption.

In accordance with the present invention this object is solved by an apparatus and a circuit, respectively, comprising the features of claim 1 and by a method comprising the features of claim 9.

The VCO for generation of a clock signal is according to the invention integrated in a (closed-loop) control circuit such that the frequency of its output signal is only determined by the circuit elements comprised in the (closed-loop) control circuit and having a low temperature coefficient These circuit elements are preferably an external current source and a capacity (or capacitance or capacitor) which can alternately be connected to an integrator circuit with the frequency of the clock signal wherein the output signal of the integrator circuit is fed to the VCO.

Particularly advantageous variations and further embodiments of the present invention are the subject-matter of further dependent claims.

The invention as well as further objects, features, advantages and applications thereof will be described in more detail in the following taking reference to the appended drawings. Therein all described and/or illustrated features taken alone or in any sensible combination form the subject-matter of the present invention independent of their summary in the claims or the dependencies thereof. In the drawings show:

BRIEF DESCRIPTION OF THE DRAWINGS

FIGS. 3(a) to 3(e) various signal curves for explaining the manner of functioning or operation of the circuit shown in FIG. 2 wherein the single illustrations are based on respective different offsets and scalings, respectively.

DESCRIPTION OF THE PREFERRED EMBODIMENTS

Taking reference to FIG. 1 the principle underlying the present invention will first be described.

The circuit for generating a clock signal or a signal having a constant frequency, respectively, which can, for instance, be used as a time basis comprises essentially a VCO (voltage controlled oscillator) 1, an integrator 2 and a (closed-loop) control circuit.

Figure 1:
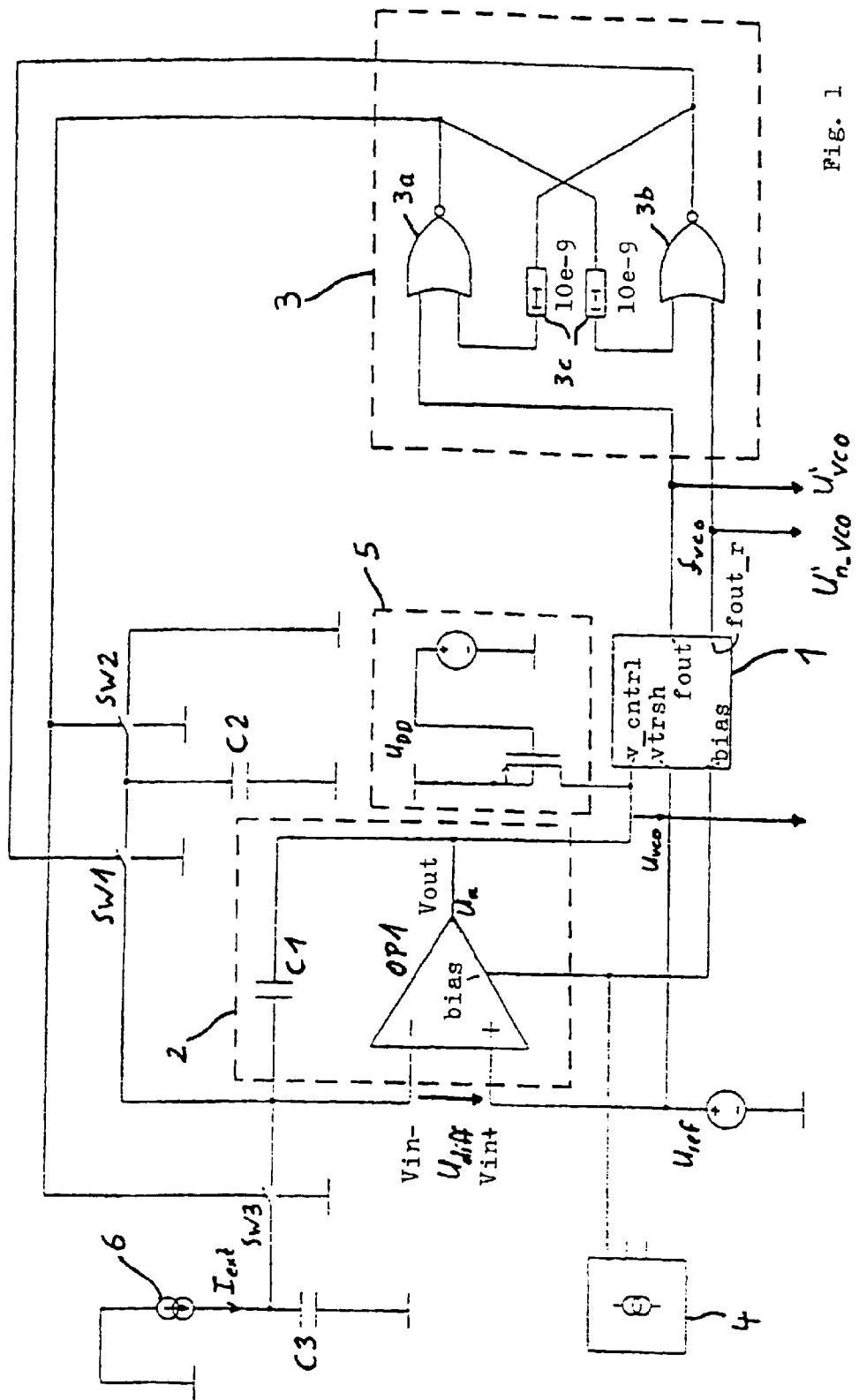
FIG. 1 a block circuit diagram for explaining the principle underlying the present invention.

The integrator 2 of the circuit of FIG. 1 is built up in a manner per se known. The integrator 2 comprises essentially an operational amplifier OP1 and a capacity C1 connected in parallel thereto. The output voltage $U_a$ of such an integrator 2 is proportional to the negative time integral of the input voltage difference $U_{diff}$ of the integrator (at least under the assumption that the (closed-loop) control circuit as described below is not present) as is known.

The input (v_cntrl) of the VCO 1 is connected to the output of integrator 2, whereas the other input (vtrsh) of VCO 1 is connected to the plus pole of the reference voltage source $U_{ref}$. The VCO 1 is a voltage-frequency-converter which converts a (direct) voltage $U_{VCO}$ applied to the input into an oscillating output signal. A VCO comprises for instance a basic circuit comprising an integrator and a trigger, wherein the integrator is triggered by a polarization changer in form of an operational amplifier connected therebetween. The frequency $f_{VCO}$ of the output signal $u'_{VCO}$ of the VCO is proportional to the input or control voltage $U_{VCO}$, respectively, of VCO 1 and the oscillating output signal can be taken or drawn off, for example, for the application as a time basis. Preferably, the voltage $U_a$ by the integrator 2 is applied to the input of VCO 1 such that at the VCO 1 an input or control voltage $U_{VCO}$, respectively, is applied and that with a, with regard to its absolute value, higher input voltage the frequency $f_{VCO}$ of the output signal becomes lower. Hence, the steepness of the corresponding characteristic is negative.

The function of VCO 1 is usually relatively strongly temperature dependent, i.e., the frequency $f_{VCO}$ of the output signal can undergo strong variations with variations of temperature which, of course, is not in general desirable. In order to avoid these variations the integrator 2 and the VCO 1 are integrated in a (closed-loop) control circuit, i.e. the output signal of VCO 1 is fed back to the integrator 2 in a special manner and thereby to the VCO 1.

The (closed-loop) control circuit shown in FIG. 1 comprises a logic network 3, two switches SW1 and SW2 being triggered or controlled by this network 3, a capacity C2, an external current source 6, a capacity C3 and a third switch SW3 also triggered or controlled by the logic network 3.

The positive input of the integrator 2 is connected to a constant voltage source so that at this input a constant reference voltage $U_{ref}$ is applied. The negative input of the integrator 2 is connected both to the external current source 6 and to capacity C2 which are connected parallel to each other. In the connection line to the capacity C2 a first switch SW1 is switched or provided. Further, in parallel to the capacity C2 a second switch SW2 is switched or provided. In the connection line to the external current source 6 a third switch SW3 is switched or provided.

The three switches SW1, SW2 and SW3 are alternately switched with the output frequency $f_{VCO}$ of VCO 1, wherein both switches SW2 and SW3 are controlled parallel in change or alternation with the switch SW1. The control is carried out using the logic network 3 such that respectively only one of the switches SW1 and SW2 is opened while the corresponding other one is closed. Therein, a security or safety phase is provided such that the respectively opened switch is only closed a predetermined time after the opening of the before-closed switch so that it is ensured that never both switches SW1 and SW2 are simultaneously closed. For the purpose of this triggering the logic network 3 exemplarily illustrated in FIG. 1 comprises two NOR gates 3$a$, 3$b$ which are connected to each other as shown in FIG. 1. In order to achieve the above-mentioned security phase the outputs of both NOR gates 3$a$ and 3$b$ are respectively returned via a time delay member 3$c$, which serves as an intermediate storage for the last state for a predetermined time, to an input of the respective other NOR gate 3$a$, 3$b$. Instead of the logic network 3 shown in FIG. 1, of course, also other logic networks with other logic circuit blocks can be used for the (closed-loop) control circuit according to the invention. The person skilled in the art of circuit technology will, without any problems, select and construct, respectively, a logic network adapted for his purposes.

In the following the manner of functioning of the logic network 3 shown in FIG. 1 will be described.

At first it will be assumed that the level of the output signal $u'_{VCO}$ of VCO 1 is high (H), i.e., the inverted output signal $U'_{n-VCO}$ of VCO 1 is low (L) and that switch SW1 is closed (1) and switch SW2 is open (0). This equivalently means that the output of the lower NOR gate 3$b$ triggering the first switch SW1 is at high level (H) and that the output of the upper NOR gate 3$a$ triggering the second switch SW2 is at low level (L). By the crosswise returning of the output signals of both NOR gates 3$a$, 3$b$ in this phase at both inputs of the upper NOR gate 3$a$ a signal with high level (H) is applied and at both inputs of the lower NOR gate 3$b$ a signal with a low level (L) is applied.

Now the output signal $u'_{VCO}$ of VCO 1 changes to the low level (L) corresponding to the frequency $f_{VCO}$, i.e., the inverted output signal $U'_{n-VCO}$ of VCO 1 changes to the high level (H). Accordingly, the lower input of NOR gate 3$b$ is now at H and the upper input of NOR gate 3$b$ is at L corresponding to the switch SW2 being opened in the previous switching phase and corresponding to the output of the upper NOR gate 3$a$ being at L, respectively. Accordingly, the lower NOR gate 3$b$ outputs an output signal having a low level (L) and the switch SW1 is opened (0). At the same time the upper input of the upper NOR gate 3$a$ is at L and the lower input of NOR gate 3$a$ is at H corresponding to switch SW1 being closed in the previous switching phase and corresponding to the output of the lower NOR gate 3$b$ being at H, respectively. Accordingly, the output of the upper NOR gate 3$a$ is at first further at L and switch SW2 remains opened (0). This means that when the output signal $U'_{VCO}$ of VCO 1 changes from H to L at first both switches SW1 and SW2 are opened. Only by opening the switch SW1 due to the L output of the lower NOR gate 3$b$ also the lower input of the upper NOR gate 3$a$ is at L, with a certain time delay due to the time delay member 3$c$, so that the output of the upper NOR gate 3$a$ changes then to H and the switch SW2 is closed (1).

Subsequently, the output $U'_{-VCO}$ of VCO 1 changes again to H so that in analogy to the above explanation the switch SW2 is opened and with a certain time delay thereto the switch SW1 is closed. Altogether, the alternate triggering of both switches SW1 and SW2 is carried out with frequency $f_{VCO}$ of the output signal $U'_{VCO}$ or $U'_{n-VCO}$, respectively, of VCO 1.

Instead of using a VCO 1 having an inverted output ($U'_{n-VCO}$) also a VCO 1 can be used which only outputs the "normal" output signal $U'_{VCO}$. In this case an inverter is inserted before the lower input of the lower NOR gate 3$b$ as a component of the logic network 3.

In the following the construction and the manner of functioning of the (closed-loop) control circuit of FIG. 1 is described in more detail under the assumption that the (closed-loop) control circuit is already at a steady state in order to explain the basic principle of the present invention.

The altogether all three switches SW1, SW2, SW3 are triggered by the logic network 3 in such a way that the switches SW1 and SW2 are alternately opened and closed and that the switches SW2 and SW3 are simultaneously opened and closed, wherein when closing the switches a time delay is provided, respectively, as has been described above to exclude short circuits in the (closed-loop) control circuit.

The external current source 6 comprises a resistor $R_{ext}$ having a temperature coefficient which is as low as possible. If the switch SW3 is opened, then the current source 6 is separated from the remaining (closed-loop) control circuit and the third capacitor C3 which serves as an intermediate storage is charged by the current source 6. When in the next switching phase the switch SW3 is closed and at the same time the first switch SW1 is opened, then the capacity C1 of the integrator 2 is charged by the current source 6 and the capacitor C3.

The capacitor C1 is charged during a half-period of the frequency of the (closed-loop) control circuit to a charge which is equal to that which would have been transported during a full period T with a continuously closed switch SW3 inasmuch as the half-period of the opened switch SW3 is compensated by the buffer capacity C3. Further, in a steady state the of the (closed-loop) control circuit the input voltage $U_{diff}$ at the operational amplifier OP1 of the integrator 2 is controlled to $U_{diff}=0$ Volt so that at the negative input of the integrator circuit 2 the potential $U_{ref}$ is applied which is also applied at the positive input. Thus, during the closed switch SW3 in total a current 1 flows through the capacitor Candy charges it up onto the charge $$Q_{in}=T \cdot I=T \cdot U_{ref}/R_{ext} \quad (1)$$

The capacity C3 ensures that in spite of temporary separation of the external current source 6 from the (closed-loop) control circuit that during an entire oscillation phase T of the (closed-loop) control circuit the capacitor C1 is as before charged with the entire charge in accordance with equation (1).

When, subsequently, the third switch SW3 is opened and the first switch is closed, then a connection of the integrator circuit 2 to the capacitor C2 is established. Then the charge Q is transported to the capacitor C2 and the latter is charged. The capacitor C2 takes up in this phase in total the charge packet $Q=U_{ref} \cdot C2$.

In the subsequent phase in which, the first switch SW1 is opened and both switches SW2 and SW3 are closed then, on the one hand, as described above, the capacitor C1 is charged up via the external current source 6 and the buffer capacitor C3 and, on the other hand, the capacitor C2 gives the charge package $$Q_{out}=Q=U_{ref} \cdot C2 \quad (2)$$

away inasmuch as both terminals of the capacitor C2 are connected to ground, i.e., are at the same potential and thus the capacitor discharges. In equilibrium both charge packets $Q_{in}$ and $Q_{out}$ have to have the same magnitude so that both equations (1) and (2) have to be equaled. Using $f_{VCO}=1/T$ it results:

$$f_{VCO}=1/T=1/(R_{ext} \cdot C2) \quad (3)$$

In the steady state of the (closed-loop) control circuit of FIG. 1 thus the frequency $f_{VCO}$ of the output signal $U'_{VCO}$ and $U'_{n-VCO}$, respectively, of VCO 1 is independent of the temperature coefficient of VCO 1 but only depends on both parameters $R_{ext}$ and C2 of the (closed-loop) control circuit which, however, have a very low temperature coefficient. For this reason the output frequency of the VCO is very stable as regards temperature and can, therefore, be used as a very accurate time basis.

Attention has to be paid in practice that the speed of the operational amplifier OP1 is high enough in order to allow a full charging of the capacitor C2 in a half oscillation period of the (closed-loop) control circuit, hence, for example within 1 μsec.

Further, in the circuit of FIG. 1 there is provided a bias voltage generation circuit 4 (bias) which is connected both as a bias voltage source to the operational amplifier and to the VCO 1.

Further, the input of VCO 1 is set to a potential $U_{DD}$ for starting operation of the circuit in order to prevent a "running away" of the capacitors. To this purpose a POC circuit 5 (power on control) is provided. Furthermore, at the beginning the integrator circuit 2 has to be connected to the external current source 6 in order to start the system. Alternatively, the VCO 1 can also be operated with an "offset frequency" in order to start the system.

In order to obtain a defined circuit state of the logic network 3 and of the switches SW1, SW2 and SW3 at the beginning of operation the time delay members 3c of the logic network 3 have to comprise an asynchronous basic setting (reset).

For a further explanation of the way of functioning of the invention in the following a preferred circuit design according to FIG. 2 which has been used to test the invention and several signal curves which have been recorded at different points of the circuit of FIG. 2 will be described taking reference to FIG. 3(a) to 3(e).

Figure 2:
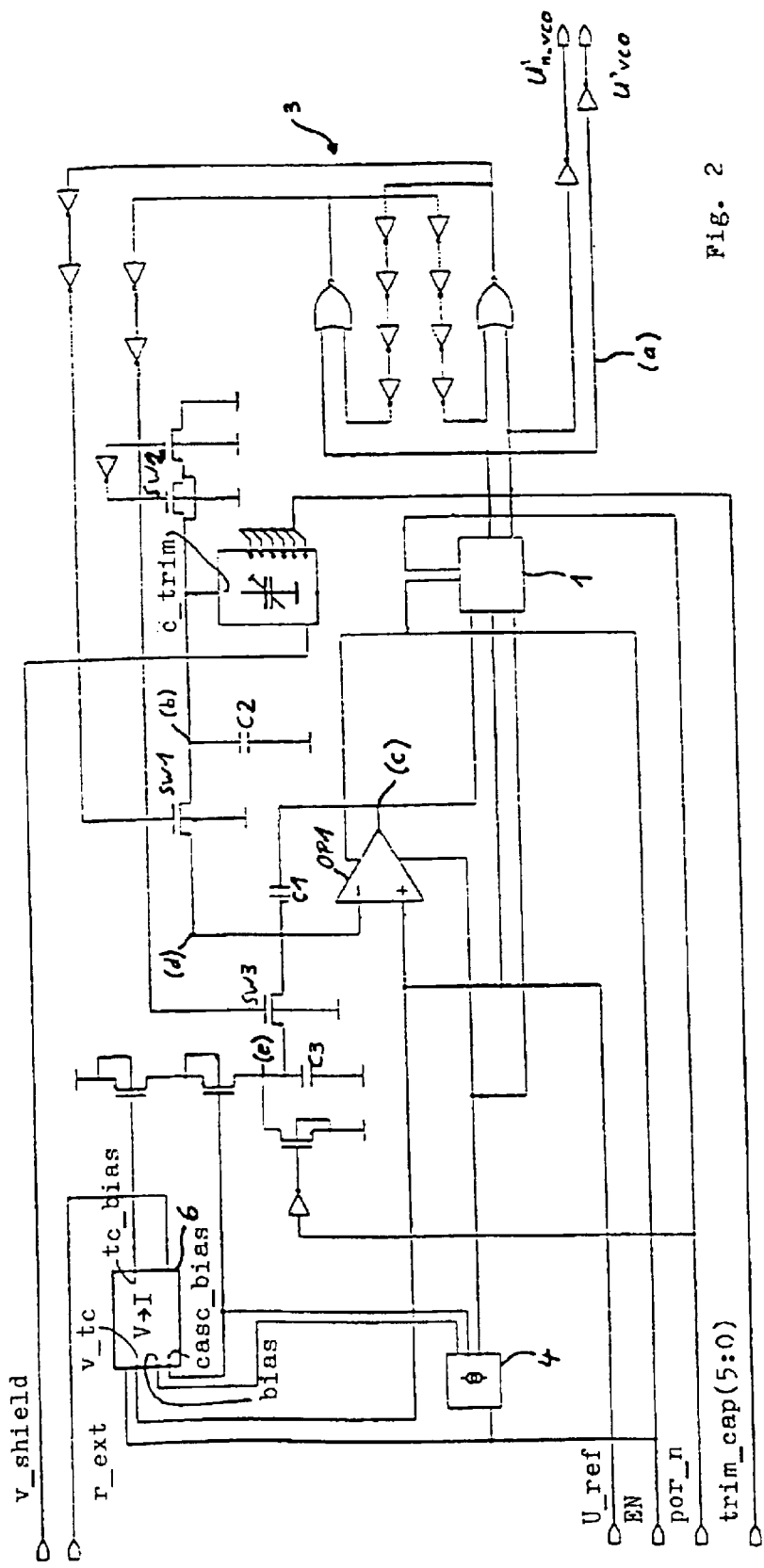
FIG. 2 the construction of the circuit according to a preferred embodiment with which the manner of functioning or operation of the present invention has been tested.

The circuit construction of FIG. 2 also consists of the components shown in FIG. 1, namely, a VCO 1, and an integrator circuit 2 comprising an operational amplifier OP1 and a capacitor C1, a logic network 3, switches SW1, SW2 and SW3 triggered by the logic network 3, a second capacitor C2, an external current source 6 having a resistor $R_{ext}$ having a low temperature coefficient and a buffer capacitor C3 for the external current source 6.

As capacities for example capacitors having capacitances of C1=10 pF, C2=730 fF and C3 =10 pF have been used. The time delay members 3c of the logic network 3 are respectively realized by an even number of inverters. As switches SW1, SW2, SW3 conventional transistors can be used.

Using the circuit shown in FIG. 2 for generation of a clock signal, for example, a clock signal having a frequency $f_{VCO}$ of 500 kHz can be generated. Due to the (closed-loop) closed control circuit according to the invention a deviation of the frequency $f_{VCO}$ of less than 1% with a temperature difference of about 100° C. can be achieved.

In the circuit shown in FIG. 2 at the positions designated by (a), (b), (c), (d) and (e) the signal behavior of the potentials present at these positions have been measured. The results of these measurements are illustrated in FIG. 3(a), 3(b), 3(c), 3(d) and 3(e), respectively.

FIG. 3(a) shows the behavior of the potential of the output signal $U'_{VCO}$ of VCO 1. The output signal $U'_{VCO}$ comprises a constant frequency $f_{VCO}$ and a constant period $T=1/f_{VCO}$, respectively. As described above during the half-period in which the output signal $U'_{VCO}$ is at a high level (H) the switch SW1 is closed and during the half-period which the output signal $U'_{VCO}$ is at low level (L) the switches SW2 and SW3 are closed. As is shown in FIG. 3(b), the capacitor C2 discharges during the half period in which the switch SW2 is closed, i.e., the output signal $U'_{VCO}$ is at low level (L).

In FIG. 3(c) the output signal $U_a$ of the integrator circuit 2 is shown which is fed to the VCO 1 as a control signal to the negative input (v_cntrl). In FIG. 3(d) the time behavior of the potential is illustrated which prevails at the negative input of the integrator circuit 2 and the operational amplifier OP1 of the integrator circuit 2, respectively. The integrator circuit 2 controls the operational amplifier OP1 such that its input difference voltage $U_{dif}$ is controlled to 0, i.e., that the potential at the negative input of the operational amplifier OP1 as the potential at the positive input of the operational amplifier OP1 is essentially at the potential Uref.

FIG. 3(e) illustrates the behavior of the charging of the capacitor C1 by the external current source 6 and the buffer capacitor C3. During the half-period which the output signal $U'_{VCO}$ of the VCO is at high level (H), the third switch SW3 is opened and the external current source 6 charges the capacitor C3. In the subsequent half-period in which the output signal $U'_{VCO}$ of VCO is at low level (L) the third switch SW3 is closed and the capacitor C1 of the integrator circuit 2 is charged by the external current source 6 as well as the charge intermediately or temporarily stored in the capacity C3.

The invention has been described above taking reference to a preferred embodiment. For a skilled person it is obvious that various variations and modifications can be made without leaving the thought underlying the present invention. Therein, the essential aspect of the invention is the circumvention of the inherent temperature dependency of the VCO by integrating it into a closed-loop control circuit determining the output frequency. In this manner a time basis can be realized in a cheap manner.

The invention can be summarized as follows:
1. Apparatus for generation of a signal having a constant frequency using a VCO (1) at the output of which a signal having a constant frequency ($f_{VCO}$) can be drawn off characterized in that the VCO (1) is integrated in a (closed-loop) control circuit such that the frequency ($f_{VCO}$) of the output signal of the VCO (1) is only determined by the circuit elements (C2, $R_{ext}$) having a low temperature coefficient contained in the (closed-loop) control circuit.
2. Apparatus according to item 1, characterized in that the input of VCO (1) is connected to the output of a integrator circuit (2).
3. Apparatus according to item 2, characterized in that the input of VCO (1) is connected to the output of the integrator circuit (2) such that an increase of the output signal ($U_a$) of the integrator circuit (2) effects a lowering of the frequency ($f_{VCO}$) of the output signal ($U'_{VCO}$) of VCO (1).
4. Apparatus according item 2 or 3 characterized in that the input of the integrator circuit (2) is connected with a parallel circuit comprising an external current source (6, $R_{ext}$) and a capacitor (C2) which are alternately separated from the integrator circuit (2) with the frequency ($f_{VCO}$) of the output signal ($U'_{VCO}$).
5. Apparatus according to item 4 characterized in that the output of the VCO (1) is connected to a logic network (3) which is connected to the switches (SW1, SW3) for control of the (closed-loop) control circuit which separate the external current source (6) and the capacitor (C2), respectively, from the integrator circuit
6. Apparatus according to item 4 or 5 characterized in that the capacitor (C2) is connected on the one hand via switch (SW1) to the integrator circuit (2) and on the other hand, via another circuit (SW2) to ground for discharging, wherein the switches (SW1, SW2) are alternately opened and closed.
7. Apparatus according to item 6, characterized in that the switch (SW2) connecting the capacitor (C2) to ground is also triggered using the logic network (3).
8. Method for generation of a signal having a constant frequency using a VCO (1) at the output of which a signal having a constant frequency ($f_{VCO}$) can be drawn off characterized in that the frequency ($f_{VCO}$) is only determined by the circuit elements (C2, $R_{ext}$) having a low temperature coefficient which are present in a (closed-loop) control circuit comprising the VCO (1).
9. Method according to item 8 characterized in that the output signal ($U_a$) of an integrator circuit (2) is fed to the input of the VCO (1).
10. Method according to item 9 characterized in that the output signal ($U_a$) of the integrator circuit (2) is fed to the input of the VCO (1) such that an increase of the output signal ($U_a$) of the integrator circuit (2) effects a lowering of the frequency ($f_{VCO}$) of the output signal ($U'_{VCO}$) of the VCO (1).
11. Method according to item 9 or 10 characterized in that the input of the integrator circuit (2) is alternately connected with the frequency ($f_{VCO}$) of the output signal ($U'_{VCO}$) to an external current source (6) and to a capacitor (C2).
12. Method according to item 11 characterized in that the alternate separation of the integrator circuit (2) from the external current source (6) and the capacitor (C2) is carried out using a logic network (3) to which the output signal ($U'_{VCO}$) of the VCO (1) is fed.
13. Use of the apparatus according to any of items 1 to 7 for generation of a time basis.
14. Use according to item 13 wherein the time basis is used in an intelligent rechargeable battery.

What is claimed is:

1. Circuit arrangement for generation of a signal having a constant frequency comprising:
   an integrator circuit; and
   a controllable oscillator;
   wherein the integrator circuit is provided for integration of an input current, the integrator circuit serves as a charge storage, an output signal of the integrator circuit is provided as an input signal for the controllable oscillator, and defined charge packets are drawn off from the charge storage in accordance with the output frequency of the controllable oscillator.

2. Circuit arrangement according to claim 1, wherein the circuit arrangement comprises as a controllable oscillator a voltage controlled oscillator (VCO) at the output of which a signal having a constant frequency can be drawn off, and that the VCO is integrated in a closed-loop control circuit such that the frequency of the output signal of the VCO is determined only by circuit elements having a low temperature coefficient comprised in the closed-loop control circuit.

3. Circuit arrangement according to claim 2, wherein the input of the VCO is connected to the output of the integrator circuit.

4. Circuit arrangement according to claim 3, wherein the input of the VCO is connected to the output of the integrator circuit such that an increase of the output signal of the integrator circuit effects a lowering of the frequency of the output signal of the VCO.

5. Circuit arrangement according to claim 3, wherein the input of the integrator circuit is connected to a parallel circuit comprising an external current source and a capacitor which are alternately separated from the integrator circuit with the frequency of the output signal.

6. Circuit arrangement according to claim 5, wherein the output of the VCO is connected to a logic network which is connected to switches for control of the closed-loop control circuit, wherein the switches separate the external current source and the capacitor from the integrator circuit.

7. Circuit arrangement according to claim 5, wherein the capacitor is connected on the one hand via a switch to the integrator circuit and on the other hand via another switch to ground for discharging, wherein the switches are opened and closed alternately.

8. Circuit arrangement according to claim 7, wherein the switch connecting the capacitor to ground is also triggered using the logic network.

9. Method for generating a signal having a constant frequency using a circuit arrangement according to claim 1, comprising:

integrating an input current of the integrator circuit serving as a charge storage;

supplying an output signal of the integrator circuit to the controllable oscillator; and drawing off charged packets from the charge storage with the output frequency of the controllable oscillator.

10. Method according to claim in 9, wherein, as a controllable oscillator a voltage controlled oscillator (VCO) is used at the output of which a signal having a constant frequency can be drawn off, and that the frequency is only determined by circuit elements having a low temperature coefficient which are present in a closed-loop control circuit comprising the VCO.

11. Method according to claim 10, wherein the output signal of an integrator circuit is fed to the input of the VCO.

12. Method according to claim 11, wherein the output signal of the integrator circuit is fed to the input of the VCO such that an increase of the output signal of the integrator circuit effects a lowering of the frequency of the output signal of the VCO.

13. Method according to claim 11, wherein the input of the integrator circuit is alternately connected with the frequency of the output signal to an external current source and to a capacitors.

14. Method according to claim 13, wherein the alternate separation of the integrator circuit from the external current source and the capacitor is carried out using a logic network to which the output signal of the VCO is fed.

15. Circuit arrangement according to claim 1, wherein the output signal of the integrator circuit is directly supplied as the input signal to the controllable oscillator.

16. Circuit arrangement according to claim 1, wherein a frequency of the output signal of the controllable oscillator varies according to an amplitude of the output signal of the integrator circuit.

17. Circuit arrangement according to claim 1, wherein the integrator circuit comprises an operational amplifier.

18. Circuit arrangement according to claim 17, wherein the integrator circuit further comprises a capacitor arranged in parallel with the operational amplifier.

* * * * *